United States Patent
Perrin et al.

[11] Patent Number: 5,981,899
[45] Date of Patent: Nov. 9, 1999

[54] CAPACITIVELY COUPLED RF-PLASMA REACTOR

[75] Inventors: Jerome Perrin, Paris; Mustapha Elyaakoubi, Massy; Jacques Schmitt, La Ville du Bois, all of France

[73] Assignee: Balzers Aktiengesellschaft, Liechtenstein

[21] Appl. No.: 08/784,578

[22] Filed: Jan. 17, 1997

[51] Int. Cl.[6] .................................................... B23K 10/00
[52] U.S. Cl. .............................. 219/121.52; 219/121.43; 219/121.48; 156/745; 118/723 R
[58] Field of Search ........................ 219/121.52, 121.43, 219/121.44, 121.48; 315/111.21, 111.31; 156/345

[56] References Cited

U.S. PATENT DOCUMENTS

| | | | |
|---|---|---|---|
| 4,482,419 | 11/1984 | Tsukada et al. | 156/345 |
| 5,061,359 | 10/1991 | Babu et al. | 204/298.07 |
| 5,361,015 | 11/1994 | Okunuki et al. | 313/309 |
| 5,543,688 | 8/1996 | Morita | 315/111.21 |
| 5,571,366 | 11/1996 | Ishii et al. | 156/345 |
| 5,593,539 | 1/1997 | Kubota et al. | 156/643.1 |
| 5,609,690 | 3/1997 | Watanabe et al. | 118/723 E |
| 5,683,548 | 11/1997 | Hartig et al. | 156/643.1 |

FOREIGN PATENT DOCUMENTS

| | | |
|---|---|---|
| 099 174 | 5/1983 | European Pat. Off. . |
| 4404077 | 8/1995 | Germany . |
| 06005522 | 1/1994 | Japan . |
| 6-211649 | 9/1994 | Japan . |
| 7-226395 | 8/1995 | Japan . |

*Primary Examiner*—Mark Paschall
*Attorney, Agent, or Firm*—Evenson, McKeown, Edwards & Lenahan, P.L.L.C.

[57] ABSTRACT

A capacitively coupled Rf plasma reactor and method in which first and second extended electrode arrangements are mutually and substantially constantly spaced and substantially enclose a plasma reaction volume within a reactor chamber. The first of the electrode arrangements is subdivided into electrically mutually isolated subelectrodes, and the second is a substrate carrier electrode for an extended substrate to be surface treated in the reactor. A first group of the subelectrodes is connected to a common first electric input, and a second group of the subelectrodes is commonly connected to a second electric input. The first and said second electric inputs being independent. Only one Rf signal generator providing an electric output is connected to both the first and second electric inputs via respective signal adjusting units to control ion bombardment on and along the flat substrate. Slits can be formed between subelectrodes of the first electrode arrangement with a width smaller than a dark space distance of a plasma generated in the reaction volume. A gas feed arrangement communicating with the bottom of the slits applies a gas between said subelectrodes defining said slits and into said reaction volume.

29 Claims, 7 Drawing Sheets

$A_1 < A_2$ $A_1 > A_2$

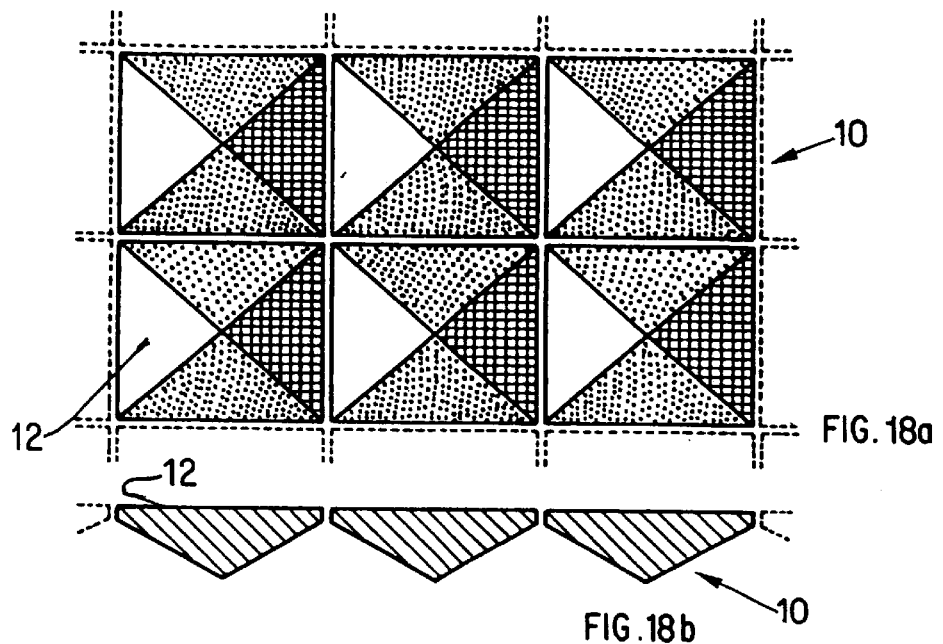
FIG. 18a
FIG. 18b
FIG. 19
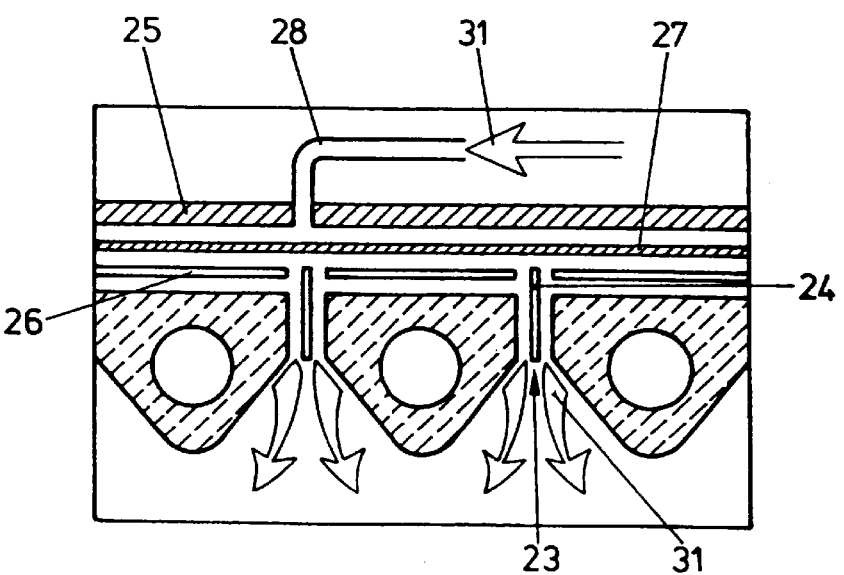
FIG. 20

CAPACITIVELY COUPLED RF-PLASMA REACTOR

BACKGROUND OF THE INVENTION

Customary, capacitively coupled RF-plasma reactors comprise first and second mutually spaced electrodes which concomitantly confine the plasma reaction volume. Besides of the two electrodes, their electrode conductive surfaces, no further electroconductive parts act as a third electrode with an externally applied electrical potential into the plasma reaction volume. Therefore, typical capacitively coupled RF-plasma reactors are also said "diode type" reactors. Confining the plasma reaction volume between the two electrodes which are mutually driven at electric RF potential is normally achieved in providing a spacing at the border of the two electrodes which suffices for electric isolation in terms of DC, but which prevents spreading of the plasma discharge outside the space confined by the two electrodes. This may be achieved e.g. by spacing the two electrodes at their periphery by a distance smaller than dark space distance at the respective operating conditions.

Such capacitively coupled RF-plasma reactors have been used for many years in the field of plasma processing, especially for treating flat substrates such as silicon wafers.

The moat common applications of such reactors are Plasma-Enhanced Chemical Vapour Deposition (PECVD) and Plasma Dry Etching. Plasma Dry Etching can be divided into Reactive Ion Etching (RIE), in which ion bombardment is used to promote an anisotropic etching, or in Plasma Etching (PE), in which ion bombardment is to be avoided.

Plasma cleaning, removal of a polymer resist (Ashing) or plasma induced surface activation of workpieces can also be performed in a capacitively coupled RF plasma reactor. Most such reactors are construed with planar electrodes.

In these applications the plasma is generated by a driving RF voltage, most commonly for industrial applications at a frequency of 13.56 MHz.

An RF-driven plasma develops a large self bias voltage between the plasma and the plasma reaction volume surrounding walls which are, as was stated, the electrode surfaces. This is due to the rectifying effect of the RF voltage across the plasma sheath by the plasma sheath according to the dark space adjacent to each of the electrode surfaces towards the plasma discharge or reaction volume. As a consequence, in a classical capacitively coupled RF reactor the ion bombardment of the workpiece or substrate is governed by the ratio between the two electrode surface areas which are in contact with the plasma discharge. Most plasma self bias, enhancing ion bombardment, arises adjacent to the electrode surface of the smaller electrode area, and the potential difference across the sheath or dark-space adjacent to the larger area electrode is accordingly smaller. This effect is conveniently exploited by plasma process designers to taylor the ion bombardment on the substrate. E.g. for RIE the workpiece or substrate is placed adjacent or on the smaller-area electrode coupled to the plasma which results in larger ion bombardment. Inversively, for PE the workpiece is placed adjacent or on the larger-area electrode where ion bombardment is smaller.

There is today a need for plasma processing of large surface workpieces as e.g. of large surface glass plates. E.g. the flat display industry is today considering manufacturing on such plates of about 1 m$^2$. The type of processes to be performed to produce the pixel related electronic circuits on such glass plates are of the same nature as the processes used in micro-electronics, but have to be performed on significantly larger surface workpieces.

If a large surface substrate is to be processed by a capacitively coupled RF plasma reactor and at process conditions similar to those as used when treating silicon wafers, the plasma gap (the distance between the two electrodes, e.g. of a planar capacitive reactor) must be kept at the predetermined value in order to achieve the number of collisions for exited species as desired. Thus, a typical value for plasma gap is between 1 and 10 cm (both limits included).

With the large surface workpieces and such plasma gaps the electrodes of the reactor take a very extended aspect ratio and the electrode surface area ratio becomes close to 1. This implies that in a capacitively coupled RF plasma reactor for large surface workpieces there is almost no control of ion bombardment. The ion bombardment occurs substantially equally at both electrode surfaces. Such a situation is strongly limiting processing large-size workpieces and especially large-size substrates by known capacitively coupled RF plasma processes as they were developped for the micro-electronic industry.

SUMMARY OF THE INVENTION

It is an object of the present invention to provide a capacitively coupled RF plasma reactor which allows treatment of large workpiece surfaces with an accurate control of ion bombardment onto the respective electrode surfaces and thus an adjacent workpiece, be it to a desired low or to a desired high level.

This is inventively achieved by the capacitively coupled RF-plasma reactor, comprising

- a first and a second electrode arrangement mutually spaced and confining a plasma reaction volume,
- at least one of the electrode arrangements comprising electrically mutually isolated sub-electrodes,
- a first group of the sub-electrodes being commonly connected to a first electric input,
- a second group of the sub-electrodes being commonly connected to a second electric input.

This concept of the novel capacitively coupled RF-plasma reactor thus substitutes at least one of the two customary used reactor electrodes by an array of sub-electrodes which by means of their respective first and second electric inputs may be independently and thus differently electrically operated, usually but not exclusively with RF voltages.

In a most preferred embodiment the sub-electrodes of one group and the sub-electrodes of the second group alternate periodically, thus e.g. one after the other as considered at least along one direction along the subdivided electrode arrangement. In the preferred mode of realisation where sub-electrodes of the at least two sub-electrode groups respectively connected to different electric inputs, especially RF inputs, are periodically alternating, the distance from one sub-electrode connected to one RF input to the next such sub-electrode connected to the same RF input and thus local periodicity of the sub-electrode pattern with respect to their electric feed should be of the order or less than the extent of the plasma gap between the two mutually facing electrode arrangements. This makes sure that the workpiece surface to be treated is subjected to an "averaged" effect of plasma discharge.

In a simplified consideration it may be said that with the inventive reactor the workpiece surface to be treated is exposed to a multitude of different sub-RF plasma discharges generated in local parallelism and operated at selectable and thus mutually different RF signal amplitudes and/or phasing and/or frequencies and/or voltage-shapes and which nevertheless interact in the plasma reaction volume to result in the said "averaged" effect.

SHORT DESCRIPTION OF THE FIGURES

The present invention shall now be described by way of examples and with reference to the accompanying drawings. They show:

FIG. 1: Schematically a prior art capacitively coupled RF-plasma reactor,

FIG. 2 to FIG. 5: four different possibilities of RF-feed to a reactor according to FIG. 1 and of arranging a workpiece with respect to larger or smaller electrode, depending on the desired ion bombardment on the surface of the workpiece to be treated, FIG. 6: the dependency of percentage of RF voltage across the plasma sheath at one electrode from substrate size and depending of whether the substrate or workpiece is deposited on the smaller or on the larger area of the plasma reaction volume confining electrodes at a prior art reactor as shown in FIGS. 1 to 5, FIG. 7: in a schematic representation the generic electrode arrangement of a reactor according to the present invention, FIG. 8: departing from the approach as shown in FIG. 7, schematically the electrode arrangement of the reactor according to the present invention with a preferred shape of sub-electrodes, FIG. 9: an enlarged view of the reactor according to FIG. 8, FIG. 10: as a function of phase-shift between RF voltages applied to sub-electrode groups at the inventive reactor and as a function of sub-electrode shape the resulting calculated percentage of RF voltage at the plasma sheath of the substrate carrying electrode arrangement, FIG. 11: the percentage of RF voltage across the plasma sheath at the substrate carrying electrode and as a function of amplitude ratio of RF voltages applied to two groups of inventively provided sub-electrodes, FIG. 12: in a schematic representation, a preferred construction of the reactor according to the present invention, FIG. 13: schematically the bottom view on the electrode arrangement subdivided in bar-shaped sub-electrodes at a reactor according to the present invention, FIG. 14: in a representation according to FIG. 13 the sub-electrode pattern with two-dimensionally arrayed sub-electrode squares, FIG. 15: in a representation according to FIGS. 13 or 14 provision of triangular sub-electrodes, FIG. 16: in a representation according to one of FIGS. 13 to 15 the provision of groups of honeycomb patterned sub-electrodes, FIG. 17: departing from a sub-electrode pattern according to FIG. 14 the bottom view (a) and cross-sectional view (b) of the sub-electrodes with surface enlarging convex roof shapes, FIG. 18: in a cross-sectional representation the shapes of a further sub-electrode embodiment with curved surface, FIG. 19: an enlarged view of a part of the reactor according to the present invention and to FIG. 12 with additional preferred features, FIG. 20: schematically the RF feed of a reactor according to the present invention, FIG. 21: schematically a first preferred realisation mode of RF feed according to FIG. 20, FIG. 22: schematically a second preferred mode of RF feed according to FIG. 20, FIG. 23: in a schematic bottom view a further structure of sub-electrodes in a centric circular pattern.

DETAILED DESCRIPTION OF THE INVENTION WITH REFERENCE TO THE FIGURES

Figure 1:
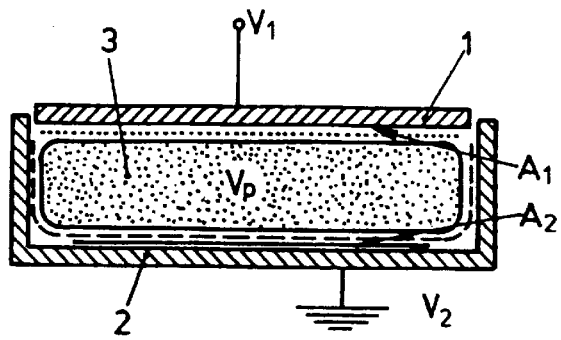
Figure 2:
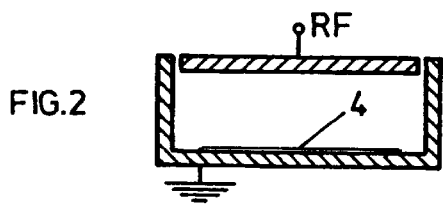
Figure 4:
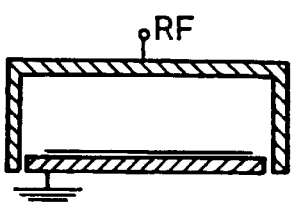
Figure 3:
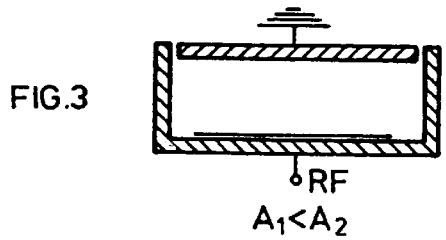
Figure 5:
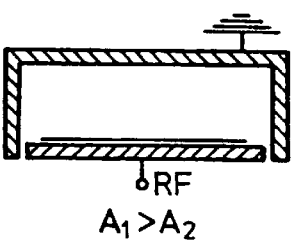

Before explaining the behaviour of the reactor according to the present invention, let us introduce the notations and the method by recalculating the electrical equilibrium of a classical capacitively coupled RF reactor as shown schematically in FIG. 1. Such reactor comprises as was said two electrode arrangements, 1, 2 with respective electrode surfaces $A_1$, $A_2$ which are both capacitively coupled to the plasma 3 within the plasma reaction volume via the respective sheath. The driving RF voltage is generated between the respective electric potentials $V_1$ and $V_2$ whereby usually one of these potentials, say $V_2$, is reference potential, normally ground potential. The plasma potential $V_p$ is unique because a plasma is a conductor and can be considered conductive as a metal for the driving frequencies considered which are well below the plasma frequency. Capacitive RF coupling between one electrode and the plasma depends on the sheath thickness. The sheath can thereby be considered as a vacuum capacitor, the thickness thereof varying with RF voltage or potential-drop across the sheath. The most commonly adopted approach consists in describing the sheath thickness as a power law of the local voltage, i.e. potential difference:

$$e_1 = e_2 |V_1 - V_p|^\alpha, \quad e_2 = e_o |V_2 - V_p|^\alpha, \qquad (1)$$

where $e_1$ and $e_2$ are the respective sheath equivalent thicknesses and a is α coefficient depending on the range of plasma condition and on the type of plasma chemistry being used.

The relation between $V_1$, $V_2$ and $V_p$ is easily derived considering that the two sheaths act as a capacitive divider:

$$(V_1 - V_p)/(V_p - V_2) = (A_2/e_2)/(A_1/e_1), \qquad (2)$$

hence $$|V_1 - V_p|/|V_p - V_2| = (A_2/A_1)^n \text{ with } n = 1/(1-\alpha). \qquad (3)$$

Figure 6:
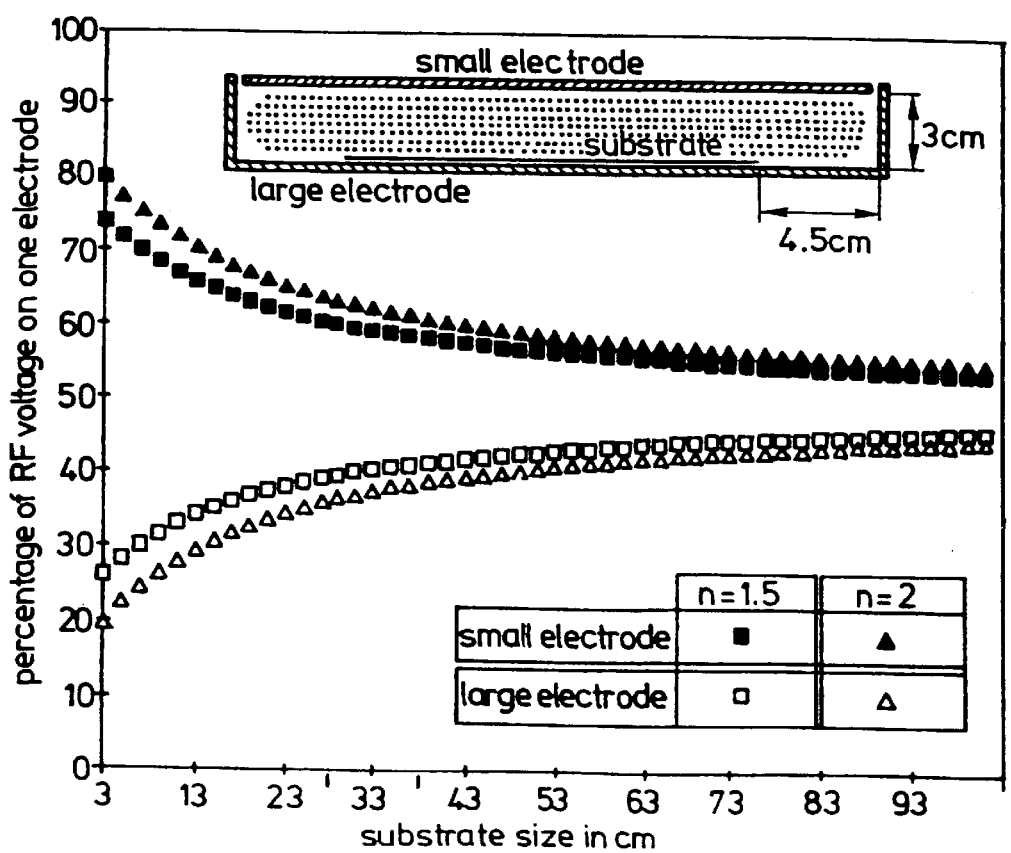

We recover here the well known power law as first derived by Koenig et al. (H. H. Koenig and L. I. Maissel, IBM J. Res. Dev. 14, 168 (1970)). In this first derivation n was estimated to be around 4 (hence α=0.75). In fact most electronic process conditions correspond more to n=1.5 to 2, (α=0.3 to 0.5). In any case the net result is that most of the RF voltage is found in front of the smaller electrode surface. The result of this calculation is displayed in FIG. 6 where the sheath RF voltage is expressed in percentage of the total RF voltage across the plasma. The calculation is for a square substrate with some reasonable assumptions for the plasma gap (3 cm) and the edge distance (4.5 cm). It appears that when the substrate size exceeds 40 cm, it is impossible with a classical reactor to develop on one electrode more than 60% of the RF voltage. It is also impossible to avoid the RF voltage on the larger electrode to be less than 40% of the total voltage.

As the DC voltage developed across an RF sheath is nearly equal to the local RF voltage amplitude, it is difficult for larger substrates to impose voluntarily a large energy ion bombardment when desired, and it is also difficult to avoid some ion bombardment where such bombardment is not desired. Hence RIE is difficult to implement in large substrate capacitive coupling RF-reactors because only half of the potential self bias will be present in front of the substrate. Recovering this factor implies increasing the RF voltage nearly by 2, hence increasing the RF power by a factor of the order of 3 to 4. On the other hand, avoiding ion bombardment is necessary for processes which are likely to cause plasma induced damages. Since this cannot be reduced by the electrode surface ratio it has to be reduced by reducing the RF amplitude at the expense of a longer process time.

In the FIGS. 2 to 5 the different applications of driving RF voltage to the two electrodes of a capacitively coupled RF reactor are shown, thereby with disposal of the workpiece either on the larger electrode for reduced ion bombardment (FIGS. 2 and 3) or on the smaller electrode (FIGS. 4 and 5) for exploiting ion bombardment.

Figure 7:
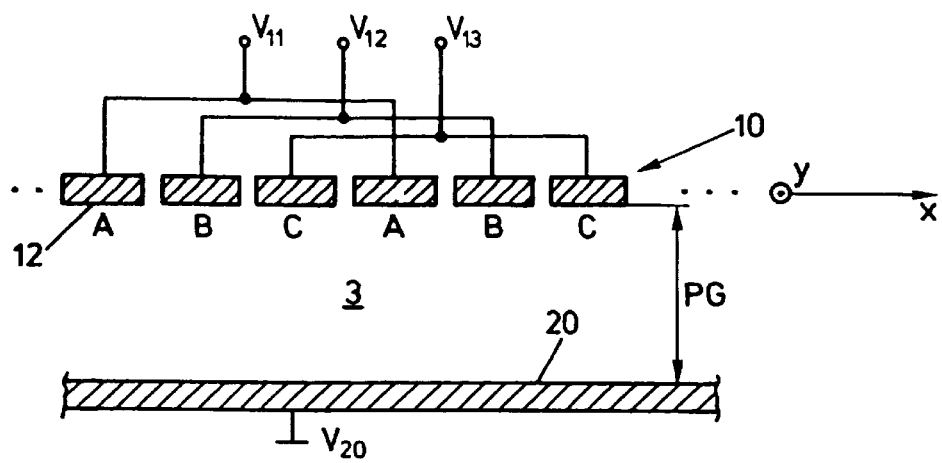

With the help of FIG. 7 the principal according to the present invention shall now be explained. Again, the plasma reaction volume 3 of the reactor is confined by two electrode arrangements 10 and 20, principally according to the reactor as shown in FIG. 1. In opposition thereto, at least one of the two electrode arrangements, according to FIG. 7 one of them, is subdivided into sub-electrodes 12. Subdivision of the electrode arrangement 10 into electrically and mutually isolated sub-electrodes 12 may be realised just in one direction x along the electrode arrangement 10 so that the sub-electrodes 12 are of a bar-like shape or may be realized in two directions x and y, so that the sub-electrodes 12 form a two-dimensional pattern.

By this it becomes possible to group the sub-electrodes 12 as shown by the groups A, B, C in FIG. 7 and to apply to each of these groups different electric potentials, especially potentials differing generically in amplitude and/or phasing and/or frequency and/or shape, thereby especially such RF potentials. Such different and preferrably mutually adjustable driving signals are shown in FIG. 7 by $V_{11}$ to $V_{13}$.

Some general consideration to this inventive concept:

It both electrode arrangements 10 and 20 are e.g. driven on RF potentials and none is linked to a reference potential as e.g. to ground potential, it is absolutely possible to subdivide both electrode arrangements 10 and 20 into sub-electrodes and to also drive the sub-electrodes of the second electrode arrangement at respectively different potentials (not shown).

In a most preferred embodiment of one of the electrode arrangements as arrangement 20 being driven on a reference potential the workpiece is deposited adjacent to the unstructured and reference potential driven electrode arrangement, i.e. adjacent to or on electrode arrangement 20 of FIG. 7.

Although it is absolutely possible so as to exploit all possible desired effects of the novel reactor structure to select the different driving voltages at different frequencies in a most preferred embodiment as proposed presently, the voltages applied differ in amplitude and/or mutual phasing.

As shown in FIG. 7 grouping of the sub-electrodes 12 is preferably realized periodically in that, considered in the direction x, sub-electrodes belonging to the groups A, B, C are arranged periodically alternating. Although this is a most preferred embodiment, it is clear that this periodicity can be omitted or locally interupted if desired.

In FIG. 7 grouping the sub-electrodes in three respectively RF-driven groups is shown. If desired, more such groups may be realised, but in the today's preferred mode the sub-electrodes are grouped in two differently and further preferrably adjustably RF-driven groups.

For the following description we refer to the case according to FIG. 7, where the sub-electrodes 12 are grouped periodically in two groups, let us say A and B.

Thereby, the periodicity, i.e. the distance between two sub-sequent sub-electrodes belonging to the same group should be of the order or less than the extent of the plasma gap according to the distance PG of FIG. 7. This will result in the fact that the workpiece is subjected to an "averaged" effect of the several "plasma columns" operated between respective sub-electrodes and the electrode arrangement 20 of FIG. 7.

Figure 8:
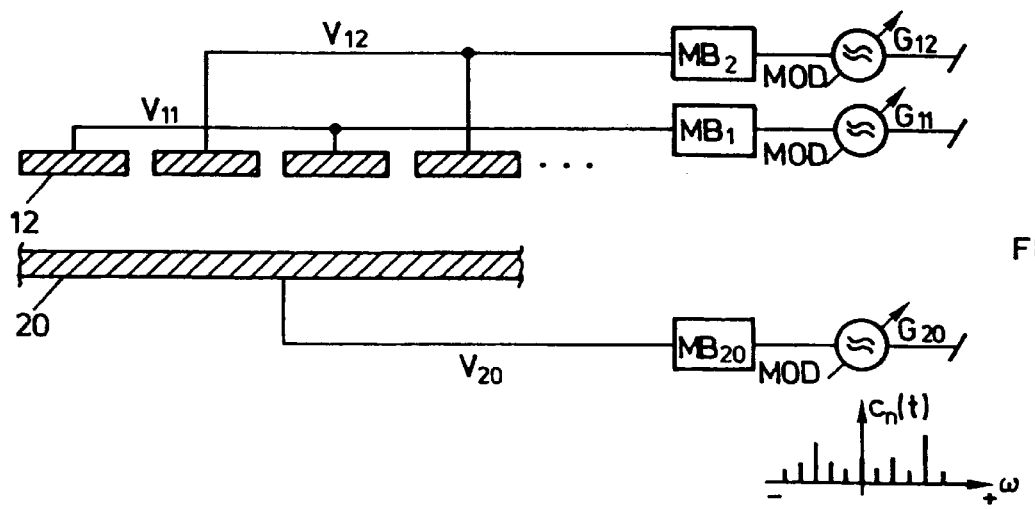

In FIG. 8, departing from FIG. 7, there is schematically shown a preferred structure of a today's implementation of the reactor according to the present invention. This preferred structure shall be the basis for the analysis as follows. Thereby, the electrode arrangement 10 is subdivided into parallel sub-electrode bars 12, grouped in two groups A and B respectively driven by RF voltages $V_{11}$ and $V_{12}$ with respect to ground potential applied to the electrode arrangement 20. Grouping the sub-electrodes 12 is periodic, as nay clearly be seen from FIG 8. The sub-electrodes 12 belonging to the respective groups are interconnected to the respective input by feed-bus $7_A$ and $7_B$.

The sub-electrodes of the group A define for plasma coupling surfaces $A_A$, whereas the aub-electrodes of group B define such surface $A_B$. The electrode arrangement 20 is coupled to the plasma reaction volume via surface $A_{20}$. Both sub-electrode groups are capacitively coupled to the plasma via the respective sheath.

Let us assume:

$$V_{11}=V_o \exp(i\phi),\ V_{12}=V_o \exp(-i\phi) \qquad (4)$$

for the two sub-electrode group driving RF voltages, i.e. the two voltages have the same amplitude, but have a mutual phase shift of $2\phi$. Phase $\phi$ and/or amplitude $V_o$ may be adjustable. As will be shown, such a reactor according to FIG. 7 and more specifically according to FIG. 8 allows to control ion bombardment regardless of workpiece or substrate size and especially in a planar geometry. Indeed, the design according to FIGS. 7 or 8 can be extended according to the workpiece extent to be treated.

As may be seen from FIG. 8 the sub-electrodes are additionally taylored to enlarge the overall coupling surface $A_{A,B}$ of the electrode arrangement 10. Due to a slope $\theta$ of the roof-shaped sub-electrode bars 12, with $\theta=45°$ according to FIG. 8, the surfaces are as follows:

$$A_A=A_B=A_{20}/2\cos(\theta). \qquad (5)$$

Figure 9:
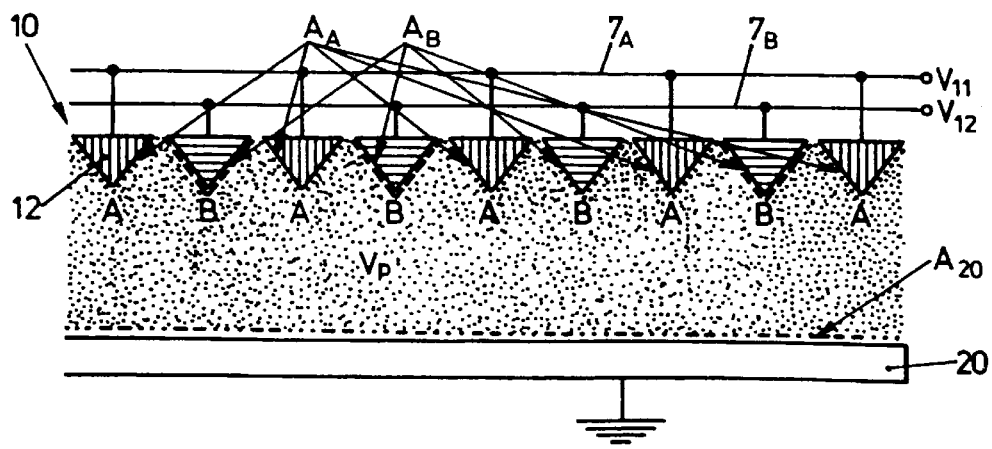

Note that, as shown in FIG. 9, which represents an enlarged part of the reactor structure according to FIG. 8, the RF coupling surfaces are evaluated in the central part of the reactor on one unit of the periodic structure. If the workpiece 4 and thus the reactor itself are very large, the border effects can indeed be neglected in this calculation. Please note that in FIG. 9 the plates $S_{11}$, $S_{12}$, $S_{20}$ represent the respective parts of electrode surfaces acting as capacitive plates.

The continuity of RF current implies the following equations;

$$(V_o \exp(+i\phi)-V_p)C_{11}+(V_o \exp(-i\phi)(-V_p)C_{22}=V_pC_{20} \qquad (6)$$

Because $A_A=A_B$ and $/V_{11}/=/V_{12}/$, then, $V_p$ is real, it has a phase centered between $V_{11}$ and $V_{12}$. The result is expressed in a rather complex form:

$$tg^2(\phi)=((X/\cos\theta)^{2/\alpha}-X^2)/(1+X)^2 \qquad (7)$$

where $X = \cos \phi (V_o/V_p) - 1.$

Figure 10:
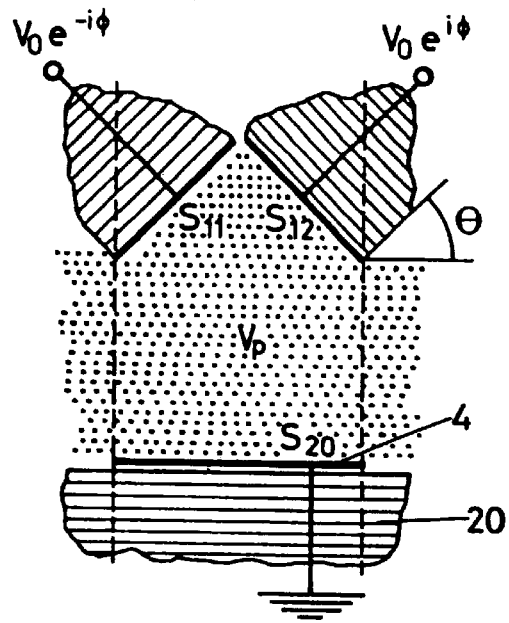

This relation was calculated for $\alpha=0.5$ (n=2) and the results are displayed in FIG. 10. FIG. 10 shows the percentage of the driving RF voltage amplitude which is present at the boundary of the sheath facing the bottom electrode 20 on which the substrate 4 is deposited. The calculation was made for four types of saw tooth profile, hence for four values of the angle θ. For zero phase shift, in other words when all electrode groups are driven by the same RF voltage, one recovers the expected results expressed in equation (3). The RF voltage is equally shared when two flat electrodes are facing each other (θ=0°). When the electrode is corrugated by the saw tooth structure, then the smallest surface electrode is the bottom electrode arrangement 20 and an increasingly large fraction of RF voltage occurs adjacent and facing the workpiece 4. Very impressive is how effective is phase shifting so as to decrease RF voltage in front of the substrate carrying bottom electrode 20. When the two driving voltages are in phase opposition, then the RF voltage in front of the workpiece carrying bottom electrode 20 becomes zero.

Although it is convenient to consider a mere phase shift betwee the driving voltages for the two electrode groups A and B according to $V_{11}$ and $V_{12}$, it is not necessary that the voltages on both sub-electrode groups of the array are of the same amplitude. Additionally or instead of the varying phasing it is also possible to vary the amplitude ratio of the driving RF voltages. For the dual periodic array as shown in the FIGS. 8 and 9 and still with a phase shift of 2φ, varying the amplitude may be expressed as follows:

$$V_{11}=V_o \exp(i\phi),\ V_{12}=aV_o \exp(-i\phi). \tag{8}$$

in which "a" is a real coefficient between 0 and 1.

Figure 11:
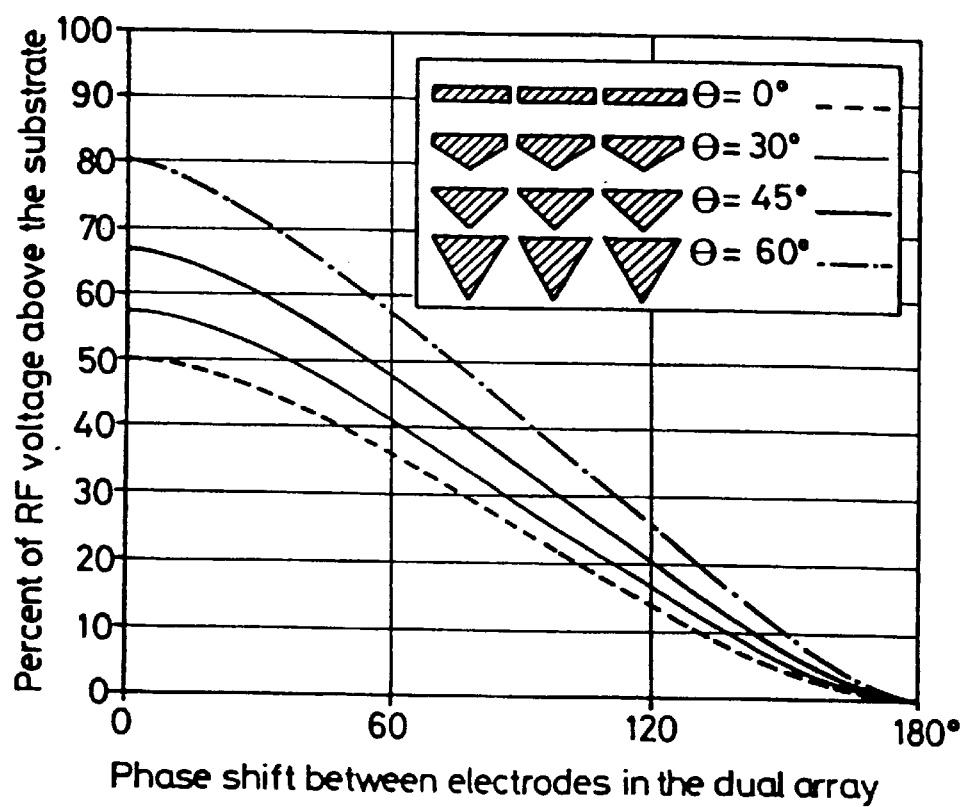

As an example we consider the case of a dual periodic array with no phase shift φ (φ=0 in equation (8) but only with a variation of the amplitude of the RF voltage at the RF input for group B, $V_{12}$. The calculation can be done the same way as above. For illustration, FIG. 11 shows the result for a saw tooth dual array with θ=45° and n=2. FIG. 11 displays the variation of the plasma RF voltage above the substrate relatively to the amplitude of the main voltage amplitude $V_o$ when the amplitude of the voltage at $V_{12}$ is varied according to "a" of (8). It is found that the plasma voltage can vary from 15 to 67% when the amplitude $aV_o$ of the voltage $V_{12}$ is varied. Even more striking is the variation the self bias of the main electrode. The self bias is calculated by assuming that the plasma sheaths are perfectly rectifying the RF voltage. It is found that the self bias changes sign when the voltage amplitude of $V_{12}$ is varied.

Figure 12:
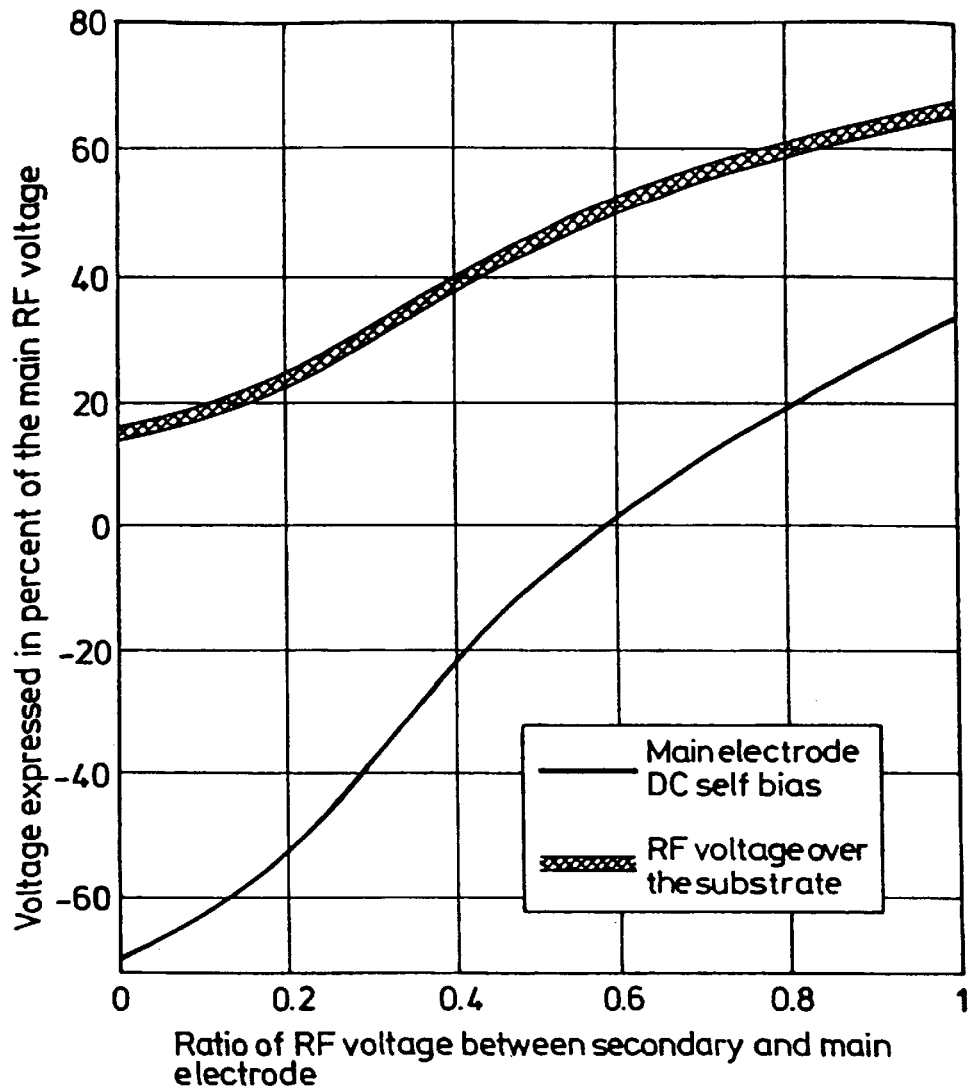

Before reporting some experimental results a preferred form of realisation of the reactor according to the present invention shall be described with the help of FIG. 12.

The bars as sub-electrodes 12 of group A are connected to the common bus-bar $7_A$ and the bars of group B to the common bus-bar $7_B$. The bus-bars 7 are respectively connected to RF power inputs $8_A$ and $8_B$. In order to avoid spurious plasma ignition the back of the sub-electrode array and the spaces between the electric connections to the sub-electrode bars 12 are shielded by spacer shields 9. The substrate 4 is deposited on the opposite electrode 20 which is preferrably grounded. All electrodes in this embodiment are cooled or temperature-controlled by a circulating fluid. The fluid is circulating in conducts 11 in the sub-electrode bars 12 of the arrangement 10 and in the base electrode arrangement 20 in conducts 12. The plasma 13 is filling the plasma gap between the electrode arrangements 10 and 20 which gap GP being somewhat larger than the distance P between two adjacent sub-electrodes 12.

As was already noted in the preferred embodiment according to FIG. 12, but also according to FIGS. 7, 8 and 9, the two sub-electrode groups are of equal surface, but it is also possible to consider the case of unbalanced surfaces of the sub-electrode groups surfaces. As also shown in the FIGS. 8 and 9 the surface of the sub-electrode subdivided arrangement 10 is voluntarily corrugated on the side facing the plasma 13. The purpose of this is to increase the surface of contact between the plasma and the electrode arrangement 10. Note that the profile of a sub-electrode 12 is effective in increasing the contact surface if the geometrical features are wide enough for the plasma to penetrate into the resulting corrugation. In the embodiment according to FIG. 12 the sub-electrode bars have again θ=45°. The surface of contact between the electrode arrangement 10 and the plasma 13 is therefore increased by a factor of √2 compared to the flat base electrode arrangement 20.

In a further preferred embodiment the base electrode 20 may be construed as a chuck for holding by suction flat workpieces 4 as glass plates to be treated. To realize such a chuck there is (not shown in FIG. 12) realized within electrode arrangement 20 a system of suction channels which abut in a multitude of suctioning holes at the upper surface of electrode 20 to snuggly hold the workpiece 4 during treatment, or there is provided an electrostatic chuck.

Experiments were performed on a reactor construed as shown in FIG. 12. Both extremes with respect to RF driving were performed, namely where both electric inputs $8_A$ and $8_B$ were driven together and thus $V_{11}=V_{12}$ see FIG. 8) and where one of the inputs $8_B$ or $8_A$ was grounded, thus realizing a=0 according to (8). The self bias potential and the RF driving amplitude were measured. As seen in Table 1, the results are qualitatively very satisfactory. In particular one observes a spectacular change of signum of the self bias when the electrode equivalent contact surface is reduced by a factor of 2 when varying the RF voltage applied to one sub-electrode group from nominal to zero. The absolute value of RF self bias does not match the theoretical estimation. This is mainly due to the fact that the measurements were performed on a rather small reactor of 500×500 mm². The calculation for an infinite reactor as shown in FIG. 11 must be corrected to take into account the contributions of the reactor edges to RF coupling. This was done in an approximate way in Table 1. Nevertheless, the drastic variations of the DC bias are astonishing. The RF bias of the processing plasma in front of the workpiece can be drastically changed by relative variation of RF input voltages on the sub-electrode groups.

TABLE 1

Comparison experiment-theory for a dual array with 45° saw tooth

| SET UP | MEASURED ON REACTOR | | | RATIO CALCULATED | |
| --- | --- | --- | --- | --- | --- |
| RF inlets | $V_0$ RF | Self bias | ratio | corrected | calculated |
| two in parallel | 306 V | +244 V | 0.79 | 0.62 | 0.33 |
| one grounded | 360 V | −142 V | −0.39 | −0.59 | −0.71 |

The corrected value is derived from a calculation as above but roughly accounting for the edge effects which are far to be negligible in relatively small reactors.

Figure 13:
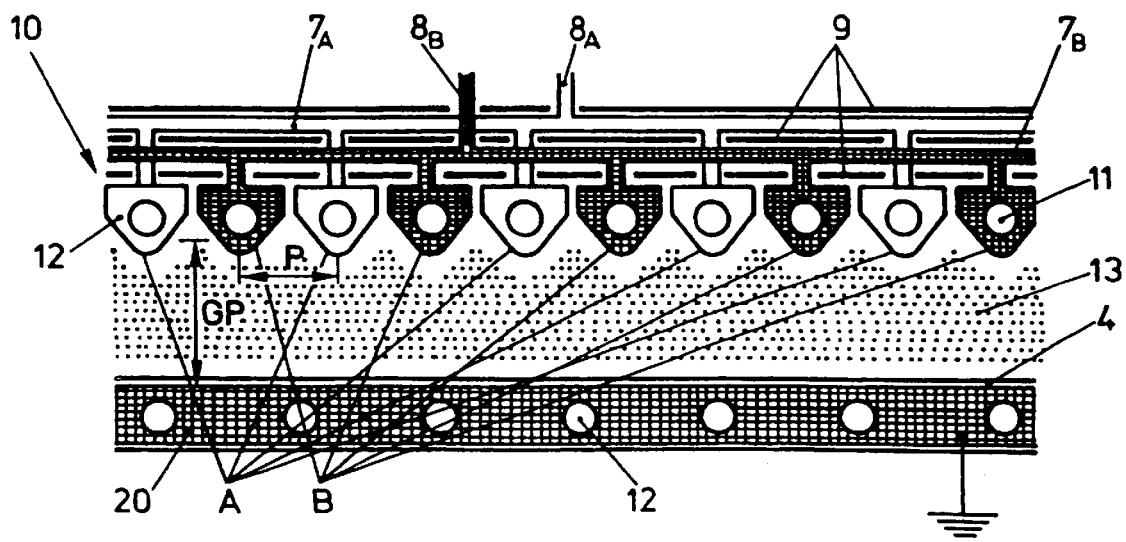

The sub-electrode design according to FIGS. 8, 9 and 12 is very simple. It is the most simple periodic structure. From the buttom it appears as parallel stripes as shown in FIG. 13 with alternated connections to the two RF inputs.

Figure 14:
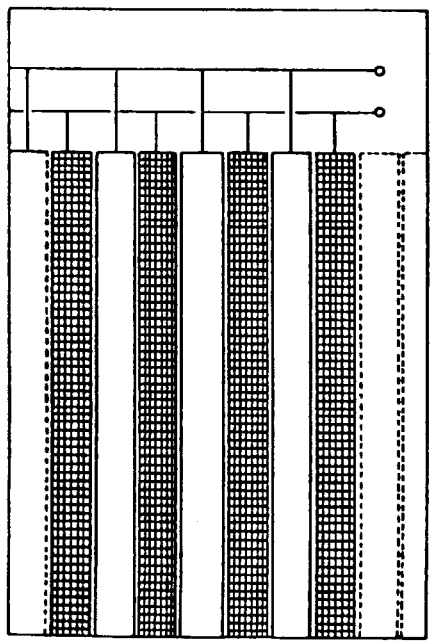

Such a periodic design can also be made periodic in two dimensions, x/y of FIG. 7. such an example is shown schematically in FIG. 14 for a square-shaped sub-electrode 12.

Figure 15:
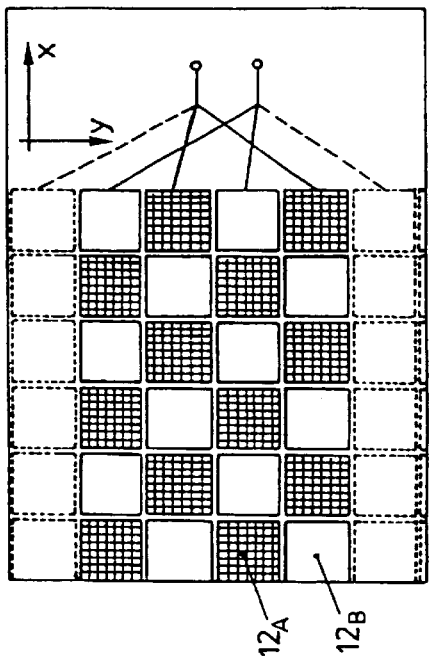
Figure 16:
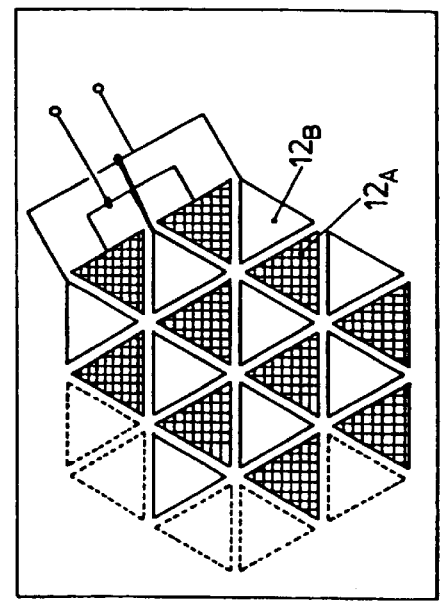

Similarly, a dual array of triangular sub-electrodes 12 can be made as schematically shown in FIG. 15. An even more sophisticated approach is shown in FIG. 16 where a triple array with three RF inputs and three groups A, B, C of sub-electrodes is realized. Again, the three corresponding driving RF voltages can be out of phase and/or of different amplitude, possibly even of different frequencies and/or voltage-shapes.

Figure 17:
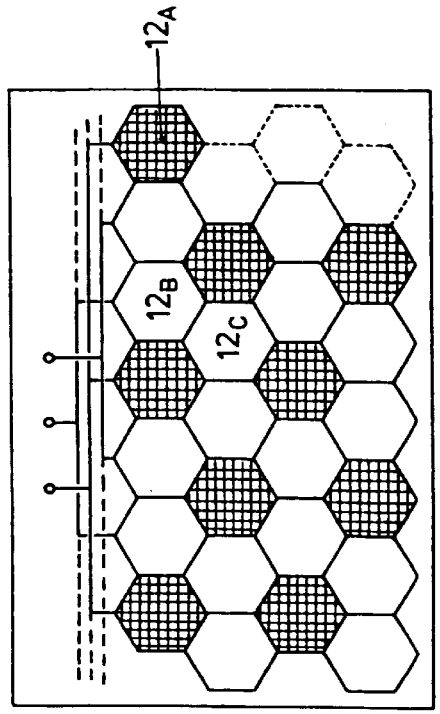

The periodic structure of the sub-electrode array can also introduce features with respect to electrode surface as does the tooth pattern which was described. A diamond shape as shown in FIG. 17 increases the RF capacitive coupling surface of each sub-electrode and may be applied to different sub-electrode structures e.g. as shown in the FIGS. 14 to 16. The sub-electrode profile can also be rounded as shown in cross-section in FIG. 18. One of the only limitations for the design rules of the electrode array structure is that when shaping the sub-electrode units, hollow volumes or volumes open to the plasma reaction volume such as holes, grooves or slots shall be wider than twice sheath thickness or dark space distance so that the plasma penetrates deeply into such recesses. In a typical plasma process the sheath thickness is a few mm, hence it is reasonable to assume that no hollow intrusion on the surface of electrode arrangement 10 should be narrower than about 1 cm if such intrusion shall add to the active coupling surface of such electrode.

Considering the reactor according to the present invention and as most generically shown in FIG. 7, it must be stated that laying the workpiece flat on the buttom horizontal electrode arrangement 20 is the most convenient approach, but the same design can be realized vertically or with the substrate and electrode arrangement 20 at top if appropriate workpiece and especially substrate holding is realized. Such different geometric arrangement can be considered with an eye on particle control.

Some preferred additional features shall be explained with an eye on FIG. 19 which shows an enlarged cross-sectional view of the sub-electrode array. In order to limit the capacitive coupling between the sub-electrodes of the e.g. two sub-electrode groups the spaces 23 between adjacent sub-electrodes can be provided with spacers 24. These spacers can be made of an insulating material such as of ceramic or of a metal, either at floating potential or at a defined potential intermediate the potentials applied to the adjacent sub-electrodes. Similarly, a shield 26 above the sub-electrodes reduces the capacitive coupling, either between the sub-electrodes and/or from the sub-electrodes to the backing ground plate 25. This shield 26 can be continuous, but then it shall be made of an insulating material such as of ceramic or if it is metallic, it shall be interrupted as shown in FIG. 19. Several shielding layers can be interposed to improve capacitive decoupling. In FIG. 19 a second shield 27 is shown to improve decoupling between the sub-electrode array and the backing ground plate 15. The shield 27 is actually a grid to allow gas to flow therethrough.

This introduces another advantage of the sub-electrode array. One can take advantage of the spacings 23 between the sub-electrodes to allow the gas 30 to flow between the sub-electrodes and into the reaction volume. For this, the process gas 31 is introduced through a piping 28 into the area behind the sub-electrode array. Means may be provided to uniformly distribute the inlet gas 31 to the gas outlets 23 as e.g. realized by the grid shield 27.

Some consideration to the RF feed system:

From the sub-electrode groups provided, at least one with at least one sub-electrode is to be RF-voltage driven.

The inputs to the groups of sub-electrodes for RF voltage shall be realized through vacuum feed-throughs 41 as shown in FIG. 20. Thereby, as is customary for RF feed, there is provided a matching box 42 matching the output of amplitude and/or phase adjustable RF generators 43 and 44. Thus, one generator 44 may e.g. be adjustable in amplitude of its out-put RF signal whereas the second generator 43 may be adjustable in phasing. Phase shift of the two RF signals input to two or more groups of the sub-electrode array may also be performed within the matchin box 42. For the skilled artisan there are many different ways for implementing the RF drive to the reactor according to the present invention.

Figure 21:
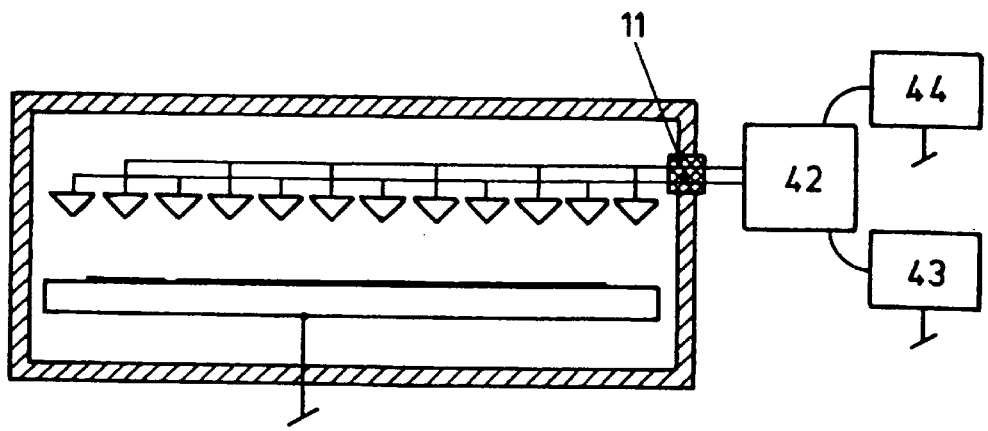
Figure 22:
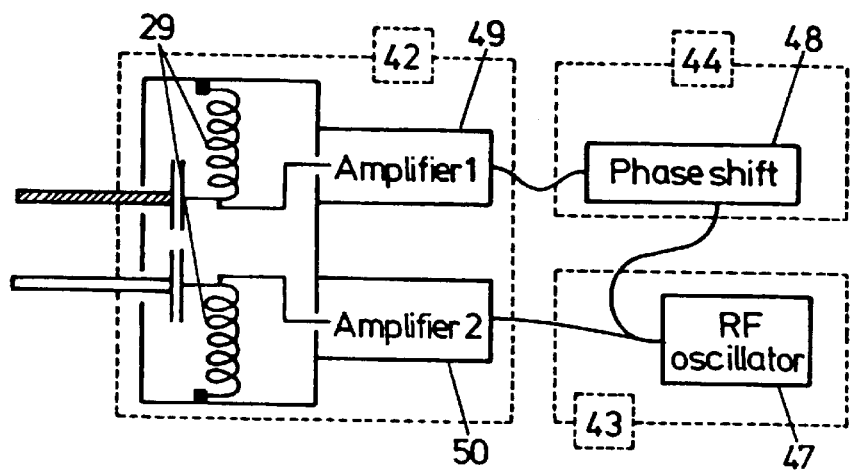

A today preferred technique is schematically shown in FIG. 21. There is provided one RF oscillator 47, the RF output thereof being led via an adjustable phase shifter unit 48 on a power amplifier 49 and additionally directly on the input of a second power amplifier 50. Preferrably, the amplifiers 49 and 50 are taylored to accept large reflected power and they are coupled to the RF inputs of the reactor via simple passive circuitery in order to roughly match the plasma impedance to the generator impedance. Another design is shown in FIG. 22 where two amplifier output stages 55 and 56 are driven by the same RF oscillator but provide for independent adjustment of amplitude and/or phasing of the output RF voltage. The generator output of the amplifier stage 55 is coupled through a classical matchbox to the primary winding 51 of a transformer. The secondary winding 60 of the transformer provides an RF voltage difference between the group inputs to the sub-electrode groups according to the present invention. The central point of secondary winding 52 is connected via a matchbox 54 to the output of the second amplifier output stage 56. Phase control and/or amplitude control is preferrably performed at amplifier stage 56 and/or 55.

Figure 23:
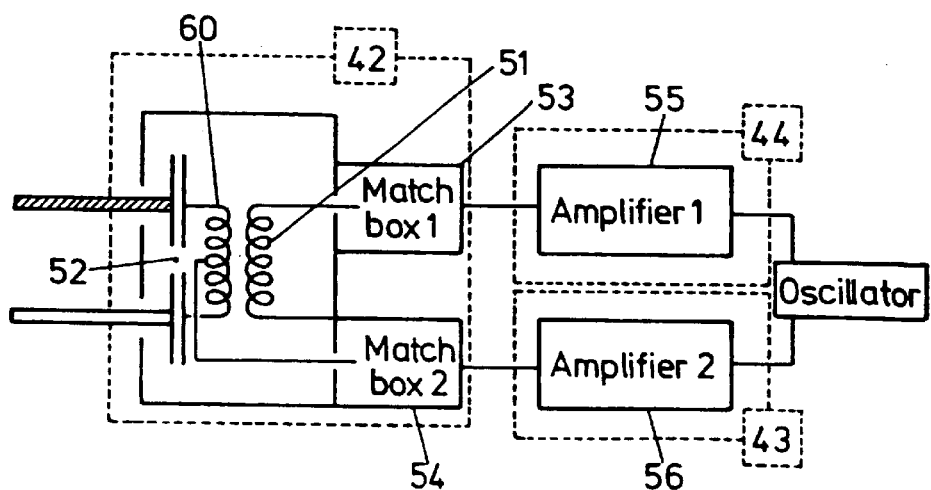

Thus, the most generic aspect of the reactor according to the present invention is to provide at least one sectioned electrode. In spite of the preferred examples described it might be interesting not to evenly space the sub-electrodes e.g. for resolving general etching problems with respect to homegeneous treatment distribution. Sub-electrodes of annular shape or of frame-like shape may be arranged around a central axis. Such a centric grouping of the sub-electrodes is schematically shown in FIG. 23.

Further, it must be pointed out that it is absolutely possible to operate one or the other or more than one of the sub-electrode groups at a predetermined non-RF potential such as on DC. It is further evident that the RF generator arrangements with phase and amplitude and possibly even freqency adjustment may be realized digitally thereby providing a power amplifier output stage to feed the sub-electrode group inputs. Also, as the inventive concept allows for separate independent inputs, it is well suited to drive the different sub-electrode groups by differently shaped voltages, briefly, one has complete freedom to operate the sub-electrode groups at any electric signal desired and mutually independently.

It is further to be pointed out that e.g. for RIE applications the reactor according to the present invention and with corrugated surface enlarging sub-electrodes may be operated with all sub-electrode groups on the same RF voltage whereby the mere fact of enlarged electrode surface at the structured electrode arrangement significantly improves ion bombardment of the substrate deposited on the counter electrode arrangement according to arrangement 20 of FIG. 7. In RIE application and making use of a reactor as shown in FIG. 12, thereby feeding all sub-electrode groups with the same RF voltage, it was possible to treat glass substrates of 370×370 mm extent by carbon deposition with a coating uniformity according to maximum deviations of 5% from the desired thicknes. After treatment, the reactor was cleaned by an oxygen plasma.

Looking back on FIG. 7, of $V_{11}, V_{12}, V_{13} \ldots$ at least one is an RF-voltage all voltages may be the same DC, AC, pulsating ramp and all kinds of voltages resulting from super-position may be applied, as DC+AC+ramp.

Especially in the embodiment according to FIG. 8 the sub-electrode groups may be driven at one common signal whereby for such a case the sub-electrodes might be conductively linked to form a corrugated electrode area so as to enlarge surface area. The same is valid for structures as shown in FIGS. 13 to 16, 17, 18.

We claim:

1. A capacitively coupled Rf plasma reactor, comprising:
   (a) first and second extended electrode arrangements mutually and substantially constantly spaced and substantially enclosing a plasma reaction volume within a reactor chamber;
   (b) said first of said electrode arrangements being subdivided into electrically mutually isolated subelectrodes, and said second being a substrate carrier electrode for an extended substrate to be surface treated in said reactor;
   (c) a first group of said subelectrodes being connected to a common first electric input;
   (d) a second group of said subelectrodes being commonly connected to a second electric input, said first and said second electric inputs being independent; and
   (e) only one Rf signal generator providing an electric output, operatively connected to both said first and second electric inputs via respective signal adjusting units to control ion bombardment on and along said flat substrate.

2. The reactor according to claim 1, wherein said subelectrodes are formed by subelectrode bars.

3. The reactor according to claim 1, wherein said first electrode arrangement is subdivided in a two-dimensional pattern into said subelectrodes.

4. The reactor according to claim 1, wherein said first electrode arrangement is subdivided into one of frame-like and annular subelectrodes.

5. The reactor according to claim 1, wherein in at least one direction along said first electrode arrangement, subelectrodes of said groups are arranged in a periodically alternating pattern.

6. The reactor according to claim 1, wherein said subelectrodes have surfaces which point towards said electrode arrangement and which are convexly or concavely enlarged.

7. The reactor according to claim 1, wherein said first and second electrode arrangements are substantially planar parallel electrode arrangements.

8. The reactor according to claim 1, wherein electric signals applied to said first and second electric inputs via said signal adjusting unit are arranged to be mutually controllable with respect to at least one amplitude, phasing and signal shapes.

9. The reactor according to claim 1, wherein the smallest distance of a space exposed to said reaction volume between neighboring subelectrodes is smaller than a dark space distance of a plasma generated in said reactor volume.

10. The reactor according to claim 1, further comprising a channel arrangement at at least one of said first and said second electrode arrangements connected to a temperature-controlled fluid source.

11. The reactor according to claim 9, said space being formed by slits between subelectrodes of said first electrode arrangement and comprising a gas inlet at the bottom of said slits.

12. The reactor according to claim 9, further comprising a gas distribution chamber on the backside of said first electrode arrangement and connected to said slits.

13. The reactor according to claim 1, further comprising shielding members, at least one of between adjacent subelectrodes and of behind subelectrodes.

14. The Rf reactor according to claim 1, wherein said first electrode arrangement forms a corrugated surface pattern so as to considerably enlarge the surface of said first electrode arrangement exposed to said plasma.

15. A capacitively coupled Rf plasma reactor, comprising
   (a) a first and a second extended electrode arrangement mutually and substantially constantly spaced and substantially enclosing a plasma reaction volume within a reactor chamber;
   (b) said first electrode arrangement being subdivided into electrically mutually isolated subelectrodes, and said second electrode arrangement being a substrate carrier electrode for an extended substrate to be surface treated in said reactor;
   (c) a first group of said subelectrodes being connected to a common first electric input;
   (d) a second group of said subelectrodes being commonly connected to a second electric input;
   (e) said first and said second electric inputs being independent of each other;
   (f) slits formed between subelectrodes of said first electrode arrangement with a width smaller than a dark space distance of a plasma generated in said reaction volume, and
   (g) a gas feed arrangement communicating with the bottom of said slits to apply a gas between said subelectrodes defining said slits and into said reaction volume.

16. The reactor according to claim 15, wherein said subelectrodes are formed by subelectrode bars.

17. The reactor according to claim 15, wherein said first electrode arrangement is subdivided in a two-dimensional pattern into said subelectrodes.

18. The reactor according to claim 15, wherein said first electrode arrangement is subdivided into one of frame-like and annular subelectrodes.

19. The reactor according to claim 15, wherein in at least one direction along said first electrode arrangement, subelectrodes of said groups are arranged in a periodically alternating pattern.

20. The reactor according to claim 15, wherein said subelectrodes which have surfaces pointing towards said electrode arrangement and which are convexly or concavely enlarged.

21. The reactor according to claim 15, wherein said first and second electrode arrangements are substantially planar parallel electrode arrangements.

22. The reactor according to claim 15, wherein electric signals applied to said first and second electric inputs via said signal adjusting unit are arranged to be mutually controllable with respect to at least one amplitude, phasing and signal shapes.

23. The reactor according to claim 15, wherein the smallest distance of a space exposed to said reaction volume between neighboring subelectrodes is smaller than a dark space distance of a plasma generated in said reactor volume.

24. The reactor according to claim 15, further comprising a channel arrangement at at least one of said first and said second electrode arrangements connected to a temperature-controlled fluid source.

25. The reactor according to claim 23, said space being formed by slits between subelectrodes of said first electrode arrangement and comprising a gas inlet at the bottom of said slits.

26. The reactor according to claim 23, further comprising a gas distribution chamber on the backside of said first electrode arrangement and connected to said slits.

27. The reactor according to claim 15, further comprising shielding members, at least one of between adjacent subelectrodes and of behind subelectrodes.

28. The reactor according to claim 15, wherein said first electrode arrangement forms a corrugated surface pattern so as to considerably enlarge the surface of said first electrode arrangement exposed to said plasma.

29. A method for treating extended substrates along their surfaces in an Rf plasma reactor having a substrate carrier electrode for said substrates and, substantially constantly spaced therefrom, a further extended electrode arrangement, said substrate carrier electrode and said further extended electrode arrangement mutually and substantially enclosing a plasma reaction volume within a reactor chamber, comprising the steps of:

(a) subdividing said further extended electrode arrangement into mutually electrically isolated subelectrodes; and (b) generating Rf plasma discharges between said subelectrodes and said substrate carrier electrode by applying electric power of only one Rf generator to said subelectrodes and substrate carrier electrode and controlling distribution of ion bombardment on said substrate by selectively adjusting power of said Rf generator applied to said subelectrodes.

\* \* \* \* \*